US010796032B2

(12) United States Patent
Shi et al.

(10) Patent No.: US 10,796,032 B2
(45) Date of Patent: Oct. 6, 2020

(54) METHOD AND SYSTEM FOR SPACE DESIGN

(71) Applicant: NORTHWEST INSTRUMENT INC., Budd Lake, NJ (US)

(72) Inventors: Xin Shi, Shanghai (CN); David Xing, Budd Lake, NJ (US)

(73) Assignee: NORTHWEST INSTRUMENT INC., Budd Lake, NJ (US)

( * ) Notice: Subject to any disclaimer, the term of this patent is extended or adjusted under 35 U.S.C. 154(b) by 0 days.

(21) Appl. No.: 16/109,826

(22) Filed: Aug. 23, 2018

(65) Prior Publication Data

US 2019/0286762 A1    Sep. 19, 2019

(30) Foreign Application Priority Data

Mar. 19, 2018    (CN) .......................... 2018 1 0223563

(51) Int. Cl.
*G06F 30/13* (2020.01)
*G01C 15/00* (2006.01)
(Continued)

(52) U.S. Cl.
CPC ............. *G06F 30/13* (2020.01); *G01C 15/00* (2013.01); *G06F 30/00* (2020.01); *G06Q 10/08* (2013.01);
(Continued)

(58) Field of Classification Search
None
See application file for complete search history.

(56) References Cited

U.S. PATENT DOCUMENTS 5,161,313 A    11/1992    Rijlaarsadam
7,032,458 B2    4/2006    Tanaka
(Continued)

FOREIGN PATENT DOCUMENTS

CN    101451831 A    6/2009
CN    104118491 A    10/2014
(Continued)

OTHER PUBLICATIONS

Phan, V. T., & Choo, S. Y. (2010). Interior design in augmented reality environment. International Journal of Computer Applications, 5(5), 16-21. (Year: 2010).*

(Continued)

*Primary Examiner* — Bijan Mapar
(74) *Attorney, Agent, or Firm* — Anova Law Group, PLLC (57) ABSTRACT

The present invention provides a method for space design, comprising: acquiring first information of a scene to be spatially designed; acquiring second information of a target object that can be placed into the scene from a third party through a communication interface; performing a visual presentation of the first information and the second information; and calculating construction information based on a layout of the target object on the visual presentation performed by the user who performs the space design. Further, the present invention also provides a system for space design, comprising: a first information acquisition module configured to acquire first information of a scene to be spatially designed; a second information acquisition module configured to acquire second information of a target object that can be placed into the scene from a third party through a communication interface; a visual presentation module configured to perform a visual presentation of the first information and the second information; and a computing (Continued)

module configured to calculate construction information based on the layout of the target object on the visual presentation performed by a user who performs the space design.

13 Claims, 2 Drawing Sheets

(51) Int. Cl.
    *G06F 30/00*     (2020.01)
    *G06T 19/00*     (2011.01)
    *G06Q 30/06*     (2012.01)
    *G06Q 10/08*     (2012.01)

(52) U.S. Cl.
    CPC ............ *G06Q 30/06* (2013.01); *G06T 19/006* (2013.01); *G06T 2210/04* (2013.01)

(56) References Cited

U.S. PATENT DOCUMENTS

| | | |
|---|---|---|
| 2002/0093538 A1 | 7/2002 | Carlin |
| 2005/0081161 A1 | 4/2005 | MacInnes et al. |
| 2007/0179645 A1 | 8/2007 | Nixon |
| 2008/0071559 A1 | 3/2008 | Arrasvuori |
| 2012/0116914 A1* | 5/2012 | Stinson ................ G06Q 10/087 705/26.5 |
| 2014/0267717 A1 | 9/2014 | Pitzer et al. |

FOREIGN PATENT DOCUMENTS

| | | |
|---|---|---|
| CN | 203958374 U | 11/2014 |
| CN | 104634222 A | 5/2015 |
| CN | 204514232 U | 7/2015 |
| EP | 0867690 A1 | 9/1989 |
| EP | 2698600 A1 | 2/2014 |
| EP | 2824525 A1 | 1/2015 |
| GB | 2513238 A | 10/2014 |
| JP | 5847348 B1 | 1/2016 |

OTHER PUBLICATIONS

Zauner, J., Haller, M., Brandl, A., & Hartmann, W. (Oct. 2003). Authoring of a mixed reality assembly instructor for hierarchical structures. In Proceedings of the 2nd IEEE/ACM International Symposium on Mixed and Augmented Reality (p. 237). IEEE Computer Society. (Year: 2003).*

Kasahara, S., Niiyama, R., Heun, V., & Ishii, H. (Feb. 2013). exTouch: spatially-aware embodied manipulation of actuated objects mediated by augmented reality. In Proceedings of the 7th International Conference on Tangible, Embedded and Embodied Interaction (pp. 223-228). ACM. (Year: 2013).*

Bhattacharya (Bhattacharya, B., & Winer, E. (Mar. 2015). A method for real-time generation of augmented reality work instructions via expert movements. In the Engineering Reality of Virtual Reality 2015 (vol. 9392, p. 93920G). International Society for Optics and Photonics.) (Year: 2015).*

Hou (Hou, L., Wang, X., Bernold, L., & Love, P. E. (2013). Using animated augmented reality to cognitively guide assembly. Journal of Computing in Civil Engineering, 27(5), 439-451.) (Year: 2013).*

Syberfeldt (Syberfeldt, A., Danielsson, O., Holm, M., & Wang, L. (2015). Visual assembling guidance using augmented reality. Procedia Manufacturing, 1, 98-109.) (Year: 2015).*

The European Patent Office (EPO) The Extended European Search Report for 16882941.4 dated Oct. 14, 2019 7 Pages.

The European Patent Office (EPO) The Extended European Search Report for 16888645.5 dated Sep. 2, 2019 10 Pages.

The European Patent Office (EPO) The Extended European Search Report for 18206500.3 dated May 14, 2019 11 Pages.

* cited by examiner

METHOD AND SYSTEM FOR SPACE DESIGN

TECHNICAL FIELD

The present invention relates generally to the field of space design, and more particularly to a method for space design and a system for space design.

BACKGROUND

In the current architecture and decoration fields, measurements are performed in the real scene firstly, and then materials and household items are selected and bought in the large shopping malls or markets according to the size data in the real scene. The selected items cannot be instantly seen on the computer or the mobile phone. Meanwhile, measurement, design, purchase and construction are separate and independent steps, thereby making the entire architecture design and construction process inefficient.

In addition, in this process, the tools used are numerous, multiple measurements and multiple records are required, and the data generated or used cannot be synchronized or shared with the data information of the CAD design system, thus making the period of design and construction very long, the cost high, and the equipment required more and the inefficiency low.

Furthermore, as constructing according to the drawings, the positioning target point needs to be determined by using the conventional measuring tool for multiple measurements, which also makes construction performed using the conventional methods according to the drawings time-consuming, labor-consuming, and inconvenient, thereby increasing the cost of the whole process.

In summary, in the prior art, either measurement, design, material selection or construction, there are many deficiencies or inconveniences such as at least the existing deficiencies:

First, in current surveying and mapping, designing and performing are completely separate, i.e., virtuality and reality are independent. Manpower is required to transfer critical data.

Second, the current surveying and mapping cannot get the results in time, cannot reflect as a whole and depends on the computer which leads to poor flexibility.

Third, in the current surveying and mapping, the positioning way is cumbersome and time-consuming.

Fourth, design sharing is inactive due to file format limitations.

SUMMARY

In view of the above technical problem, the prior art designing and performing are completely separated, so that the design efficiency is low, and the current surveying and mapping cannot acquire the drawing result in time, and thus cannot directly reflect the whole, resulting in the existing design method being too dependent on the computer, which leads to poor flexibility.

The inventor of the present disclosure considers to integrating design, material selection, purchase, payment, express delivery, and construction into a large system platform, and combining smart tools with the support of respective applications, servers, and e-commerce platforms, so as to achieve data sharing, real-time feedback, rapid measurement, rapid design, rapid material selection, rapid construction, and to form the seamless connection of each stage, to real-time monitor, and then to effectively control the human, resource and time costs of each stage so as to improve the efficiency of performing eventually.

A first aspect of the present disclosure provides a method for space design, the method comprising:
acquiring first information of a scene to be spatially designed;
acquiring second information of a target object that can be placed into the scene from a third party through a communication interface;
performing a visual presentation of the first information and the second information; and
calculating construction information based on a layout of the target object on the visual presentation performed by the user who performs the space design.

In this way, on one hand, it is possible to simultaneously acquire information about a scene and a target object to be placed in the scene from a device such as a portable device, after performing the visual presentation of the information, the user who performs the space design can observe the design effects in real-time base on the layout of the target object on the visual presentation, thereby determining whether to purchase, the construction can further be instructed according to the calculated construction information after designing, thus the design on the virtual visual presentation may be put into practice to recover to the actual scene.

In one embodiment in accordance with the present disclosure, the method further comprises:
outputting the calculated construction information through the communication interface.

In one embodiment in accordance with the present disclosure, outputting the calculated construction information through the communication interface comprises outputting the calculated construction information, through the communication interface, to a ranging and positioning apparatus that performs ranging and positioning, such that the ranging and positioning apparatus performs positioning of the target object according to the construction information. Those skilled in the art should understand that the ranging and positioning apparatus here refers to a type of apparatus, for example, a surveying tool such as a ranging instrument, a ranging wheel and the like, or a smart terminal such as a mobile phone or a Pad, and AR glasses, etc.

The embodiment according to the present disclosure can allow the ranging and positioning apparatus to acquire the calculated construction information in a communication manner such that the ranging and positioning apparatus performs positioning of the target object according to the construction information.

In one embodiment in accordance with the present disclosure, the construction information comprises construction marking points displayed on the visual representation to implement the layout of the target object by augmented reality technology.

In such an implementation, another method can be provided to implement the layout, i.e., the layout of the target object is implemented by augmented reality techniques by means of displaying construction marking points on the visual representation.

In one embodiment in accordance with the present disclosure, the first information and/or the second information comprises size information, in the process of placing the target object into the scene and performing the design by the user, the size of the target object and the size information of the scene are matched, and the position information of the target object in the scene is generated in real time.

In this way, it is possible to observe on the visual presentation whether the target object is suitable for placing in the scene based on the size information and position information, and further, if the target object is suitable for being placed in the scene, the visual effect can be determined based on the size information, and then the layout of the target object will be optimized.

In one embodiment in accordance with the present disclosure, the first information and/or the second information further comprise color information and/or material information. In addition, optionally, the first information and/or the second information may further comprise information such as texture information, personal preference or behavioral habit record.

In such an embodiment, in addition to the size information, it is also possible to the user who performs the space design can observe the design effects in real-time base on the layout of the target object on the visual presentation after performing the visual presentation of the information, except for the size matching effect, these design effects can also comprise color matching effect and material matching effect, etc., and the presentation of design effects may be further optimized.

In one embodiment in accordance with the present disclosure, the second information further comprises brand, price, inventory, hyperlink information associated with the target object.

In such an embodiment, after the user who performs the space design observes the design effects in real-time based on the layout of the target object on the visual presentation, the user can place an order directly on a third party shopping platform such as Jingdong, Taobao, Amazon and the like according to brand, price, inventory, hyperlink information associated with the target object included in the second information, thereby improving design and corresponding construction efficiency and reducing costs.

In one embodiment of the present disclosure, acquiring the first information of the scene to be spatially designed further comprises:

measuring and acquiring, by the ranging and positioning apparatus, the first information of the scene to be spatially designed; or receiving the first information of the scene to be spatially designed in a communication manner.

In such an implementation, on one hand, the method for space design can receive the first information of the scene to be spatially designed, such as an apartment layout and the like, in a communication manner; on the other hand, the method can measure and acquire the first information of the scene to be spatially designed by the ranging and positioning apparatus, such as by means of photographing and tool measuring, or by means of photographing and inputting the size information, or by photographing and a reference object with the size information. Here, the first information can be for example the pre-designed drawing.

Further, a second aspect of the present disclosure also provides a system for space design, the system comprising:

a first information acquisition module configured to acquire first information of a scene to be spatially designed;

a second information acquisition module configured to acquire second information of a target object that can be placed into the scene from a third party through a communication interface;

a visual presentation module configured to perform a visual presentation of the first information and the second information;

a computing module configured to calculate construction information based on a layout of the target object on the visual presentation performed by a user who performs the space design.

In one embodiment in accordance with the present disclosure, the system further comprises:

an information output module configured to output the calculated construction information through the communication interface.

In one embodiment in accordance with the present disclosure, the information output module is further configured to output the calculated construction information, through the communication interface, to a ranging and positioning apparatus that performs ranging and positioning, such that the ranging and positioning apparatus performs positioning of the target object according to the construction information.

In one embodiment in accordance with the present disclosure, the construction information comprises construction marking points displayed on the visual presentation to implement the layout of the target object by augmented reality technology.

In one embodiment in accordance with the present disclosure, the first information and/or the second information comprise size information.

In one embodiment in accordance with the present disclosure, the first information and/or the second information further comprise color information and/or material information.

In one embodiment in accordance with the present disclosure, the second information further comprises brand, price, inventory, hyperlink information associated with the target object.

In one embodiment in accordance with the present disclosure, the first information acquisition module is further configured to:

measure and acquire, by the ranging and positioning apparatus, the first information of the scene to be spatially designed; or receive the first information of the scene to be spatially designed in a communication manner.

In summary, the method for space design and the system for space design according to the present disclosure can acquire information about a scene and a target object to be placed in the scene from a device such as a portable device simultaneously, after performing the visual presentation of the information, the user who performs the space design can observe the design effects in real-time base on the layout of the target object on the visual presentation, thereby determining whether to purchase, the construction can further be instructed according to the calculated construction information after designing, thus the design on the virtual visual presentation may be put into practice to recover to the actual scene.

BRIEF DESCRIPTION OF THE DRAWINGS

Embodiments are illustrated and described with reference to the figures. These figures are used to clarify the basic principles and thus only illustrate the aspects necessary to understand the basic principles. The drawings are not to scale. In the figures, the same reference numerals indicate similar features.

Other features, aspects, advantages and benefits of the present invention will become more apparent by the following detailed description in conjunction with the accompanying figures.

DETAILED DESCRIPTION

In the following detailed description of the preferred embodiments, the reference is made to the accompanying figures that are composed as a part of the invention. The accompanying figures illustrate, by way of example, specific embodiments of the invention. The example embodiments are not intended to be exhaustive of all embodiments in accordance with the invention. It will be appreciated that other embodiments may be utilized and structural or logical modifications may be made without departing from the scope of the invention. Therefore, the following detailed description is not to be limited, and the scope of the invention should be limited only by the attached claims.

The technical solution claimed in the present disclosure is based on the following inventive concepts, namely:

The inventor of the present disclosure contemplates that big data storage is implemented by disposing user servers and e-commerce servers to the cloud, data in databases of user servers and e-commerce servers is processed by utilizing cloud computing, and data intercommunication is implemented by connecting mobile applications to web pages via the Internet, thereby integrating a big network data computing communication platform. The user browses e-commerce websites using the mobile phone or the computer terminal, and designs data module which is sent from the server on the cloud to the user smart terminal device in the Internet manner. The Internet manner here can comprise, for example, email, webpage WEB manners or other manners compliant with specific network protocols. The application on the smart terminal may import the data template into the application for re-design and adjustment.

Figure 1:
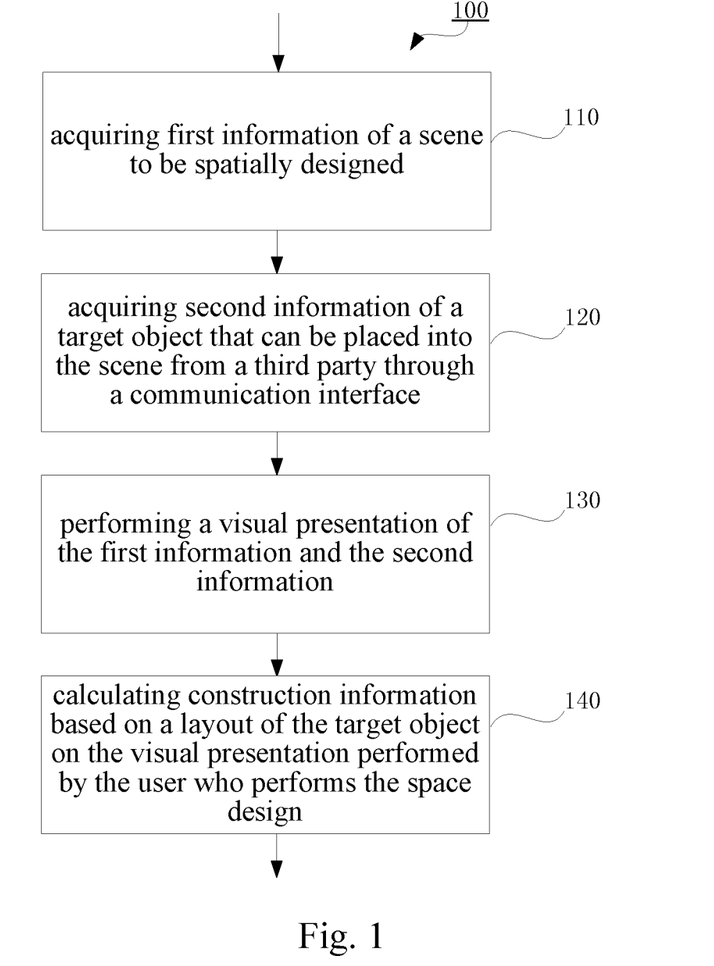
FIG. 1 illustrates a flow chart of a method 100 for space design in accordance with the present disclosure.

FIG. 1 illustrates a flow chart of a method 100 for space design in accordance with the present disclosure, as can be seen from the figure, the method 100 for space design comprises the following steps:

First, in the method step 110, first information of a scene to be spatially designed is acquired, wherein the first information can comprise size information, for example, a scene to be placed, such as a room size or a wall size, etc., optionally the first information can also comprise color information and/or material information, texture information, the information indicating that the background color of the wall is yellow, beige, etc., and can also comprise, for example, background pattern information, for example, the information indicating the wall is a latex paint wall or a pink wallpaper wall, and the information about decoration such as a wall painting on the wall.

Then, in method step 120, second information of a target object that can be placed into the scene is acquired from a third party through a communication interface; wherein the second information can comprise size information, such as size information of a sofa, a dining table, a photo frame to be placed into the scene, optionally, the second information can also comprise color information, material information, and texture information, for example, the information indicating that the color of the sofa is white or beige, the surface of the end table is marble texture, etc., for example, can also comprise the information indicating that the color of the border of the photo frame is gold, the border of the photo frame is aluminum alloy, and the picture, pattern in the photo frame.

More preferably, the second information can also comprise brand, price, inventory, hyperlink information associated with the target object (e.g., a sofa, a photo frame). Generally speaking, after completing the design by the application on the terminal device, the commodities on the e-commerce platform used in the design can be summarized and directly purchased. The user's information (name, contact information, payment method) and product information (price, model, quantity, etc.) may be integrated to generate order information by connecting to the e-commerce platform server on the cloud through the Internet. Users can complete order transactions directly on the terminal device or on the e-commerce platform website.

Next, in method step 130, the first information and the second information will be visually presented. Here, as the computer technology employed for visual presentation or rendering is a conventional means used by those skilled in the art, here will not be described for the sake of brevity.

In the case where the first information and the second information comprise the size information, in the process of placing the target object into the scene and performing the design by the user, the size of the target object and the size information of the scene are matched, and the position information of the target object in the scene is generated in real time, thereby observing on the visual presentation whether the target object is suitable for placing in the scene based on the size information and position information, and further, if the target object is suitable for being placed in the scene, the visual effect can be determined based on the size information, and then the layout of the target object will be optimized. For example, for a relatively small room, although a six-foot bed can be put down, the designer will not consider purchasing a bed of this size because the placement of a six-foot bed in the relatively small room is neither aesthetical nor practical.

In the case where the first information and the second information optionally comprise, for example, color information and material information other than size information, after performing the visual presentation, the user who performs the space design can observe the more realistically design effects in real-time based on the layout of the target object on the visual presentation, in other words, can also implement the presentation in a three-dimensional stereoscopic effect, or by means of VR technology or AR technology, and in the three-dimensional mode, the user may view the design effects from different angles. Except for the size matching effect, these design effects can also comprise color matching effect and material matching effect, etc., and the presentation of design effects may be further optimized. For example, a dark-colored wall background is not suitable for decorating a light-colored photo frame, which cannot be determined only based on the size information without the color information or the material information; but once the first information and the second information containing for example, the color information and the material information other than the size information, the designer can make the determination easily.

As the second information optionally further comprises brand, price, inventory, hyperlink information associated with the target object (e.g., a sofa, a photo frame), after the user who performs the space design observes the design effects in real-time based on the layout of the target object on the visual presentation, the user can place an order directly on the third party shopping platform such as Jingdong, Taobao, Amazon and the like according to brand, price, inventory, hyperlink information associated with the target object included in the second information, thereby improving design and corresponding construction efficiency and reducing costs.

Preferably, the first information and/or the second information can further comprise information such as a personal preference or a behavioral habit record, and as the target object is acquired from the third party, the target object can be selected preferentially according to the information of the scene with personal preferences or behavioral habits, i.e., the third party platform may preferentially push the target object which is more matchable with preferences and behavior habits according to the information of the scene, thereby saving the time for the user to select and bringing better design experience.

Generally speaking, the application on the user terminal device can be connected with the smart tool, the user may test the construction site by the smart tool and test all useful data (for example, comparing the size on the drawings, the distance data, etc. with the actual measurement to determine whether these match each other or not), and then to generate 2D or 3D drawings. The design data template acquired by the e-commerce platform is imported into the application, and the user can re-design and edit the drawings, simulate and view the design effects.

Finally, in method step 140, the construction information will be calculated based on the layout of the target object by the user who performs the space design on the visual presentation. In this way, on one hand, it is possible to simultaneously acquire information about a scene and a target object to be placed in the scene from a device such as a portable device and generate related position information, after performing the visual presentation of the information, the user who performs the space design can observe the design effects in real-time base on the layout of the target object on the visual presentation, thereby determining whether to purchase, the construction can further be instructed according to the calculated construction information after designing, thus the design on the virtual visual presentation may be put into practice to recover to the actual scene. Generally speaking, after the user bought the commodities, the user can cooperate with the application on the smart terminal and the smart tool (such as the ranging and positioning instrument) to map, position, and then construct according to the design drawings in the on-site environment. Since the design files disclosed in the present disclosure can employ both conventional CAD format drawing files and new format files different from conventional CAD design drawings, these design files may be shared quickly by the current mainstream transmission ways (for example, network http/https download, mail, Apple airdrop, etc.) or social media sites. In addition, the measurement results of the smart mapping device (such as the ranging and positioning apparatus) are transmitted to the application software instantaneously, automatically and automatically, and the corresponding virtual objects in the drawings are automatically generated. The drawings in the application software can be edited and designed in real-time, and the acquired results can be shared by the current mainstream transmission ways (such as network http/https download, mail, apple airdrop, etc.). In addition, the drawings acquired by any way can be opened in the application software and quickly positioned by Bluetooth-driven smart mapping equipment, which saves time and effort, quickly transforms the virtual design into real construction information to guide the layout of decorative objects such as purchased furniture.

After calculating the construction information, how to further guide the user who performs the space design to recover the virtual space design to a real scene, the method can also comprise outputting the calculated construction information through the communication interface. Those skilled in the art should understand that the communication interface of the present invention comprises a wired interface, a Wi-Fi interface, a Bluetooth interface, a network interface, and other types of wireless communication technology interfaces, such as a ZigBee interface, an infrared interface, an NBIOT interface, a short message, and the like. In one embodiment in accordance with the present disclosure, outputting the calculated construction information through the communication interface comprises outputting the calculated construction information, through the communication interface, to a ranging and positioning apparatus to enable the ranging and positioning apparatus position the target object according to the construction information. The implementation in accordance with the present disclosure can allow the ranging and positioning apparatus to acquire the calculated construction information by means of communication, thereby causing the ranging and positioning apparatus to perform positioning of the target object based on the construction information.

Optionally or alternatively, in one embodiment in accordance with the present disclosure, the construction information comprises construction marking points displayed on the visual representation to enable layout of the target object by augmented reality technology. In such an implementation, another way can be provided to implement the layout, that is, to achieve the layout of the target object by augmented reality technology techniques in the way of construction marking points displayed on the visual presentation.

In addition, the first information of the scene to be spatially designed in the method step 110 can also be implemented in various manners. The first way is to acquire the first information to be spatially designed by the ranging and positioning apparatus, for example, by means of photographing and tool measuring, or by means of photographing and inputting the size information, or by photographing and a reference object with the size information; in addition, the second manner can receive the first information of the scene to be spatially designed in a communication manner, such as an apartment layout or ready-made design drawings, scene graph, and the like.

Figure 2:
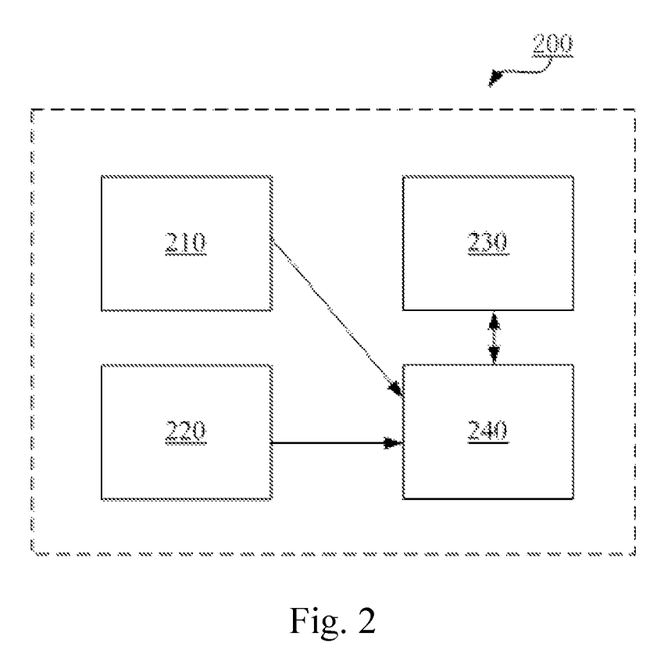
FIG. 2 illustrates a schematic diagram of a system 200 for space design in accordance with the present disclosure.

Further, the present disclosure also provides a system for space design implementing the above described method for space design, and FIG. 2 illustrates a schematic diagram of a system 200 for space design provided in accordance with the present disclosure. As can be seen from the figure, the system 200 for space design comprises the following modules: a first information acquisition module 210 configured to acquire first information of a scene to be spatially designed; a second information acquisition module 220 configured to acquire second information of a target object that can be placed into the scene from a third party through a communication interface; a visual presentation module 230 configured to visually present the first information and the second information; and a computing module 240 configured to calculate construction information based on the layout of the target object on the visual presentation performed by a user who performs the space design.

Here, the calculation module 240 can be, for example, a processor capable of performing the visual presentation of the first information of the scene to be spatially designed which is acquired by the first information acquisition module 210 and the second information of the target object of the scene which is acquired by the second information acquisition module 220 from the third party through the communication interface, to visually present the first information and the second information in the visual presentation module 230, and the visual presentation module 230 may be for example, a touch screen with a touch function.

In FIG. 2, the first information acquisition module 210 and the second information acquisition module 220 can be information receiving modules, can also be image acquisition modules such as an image acquisition module of a camera, which can acquire the first information associated with the scene to be spatially designed and the second information associated with a target object that can be placed into the scene. After acquiring the first information associated with the scene to be spatially designed and the second information associated with the target object that can be placed into the scene, the one-way arrow in FIG. 2 indicates that these pieces of the information may be output to, for example, the calculation module 240 of the processor, the calculation module 240 may perform the visual presentation of the first information of the scene to be spatially designed which is acquired by the first information acquisition module 210 and the second information of the target object of the scene which is acquired by the second information acquisition module 220 from the third party through the communication interface, to visually present the first information and the second information in the visual presentation module 230 such as a touch screen with a touch function.

Next, the designer may arrange the target object on a visual presentation module 230 such as a touch screen, and the calculation module 240 calculates the construction information based on the layout of the target object on the visual presentation made by a user who performs the space design, that is, the calculation module 240 may receive the design data by the visual presentation module 230, i.e., the drawing design data after the layout layout, and then the calculation module 240 may calculate construction information based on the layout of the target object on the visual presentation made by a user who performs the space design. It can be seen that the information interaction between the computing module 240 and the visual presentation module 230 may be bidirectional, and represented by a double-headed arrow in FIG. 2.

In one embodiment in accordance with the present disclosure, the system 200 further comprises an information output module (not shown) configured to output the calculated construction information through the communication interface. In one embodiment in accordance with the present disclosure, the information output module is further configured to output the calculated construction information, through the communication interface, to a ranging and positioning apparatus that performs ranging and positioning, such that the ranging and positioning apparatus performs positioning of the target object according to the construction information. In one embodiment in accordance with the present disclosure, the construction information comprises construction marking points displayed on the visual representation to implement the layout of the target object by augmented reality technology.

In one embodiment in accordance with the present disclosure, the first information and/or the second information comprise size information. In one embodiment in accordance with the present disclosure, the first information and/or the second information further comprise color information and/or material information. In one embodiment in accordance with the present disclosure, the second information further comprises brand, price, inventory, hyperlink information associated with the target object.

In one embodiment according to the present disclosure, the first information acquisition module 210 is further configured to: measure and acquire the first information of the scene to be spatially designed by the ranging and positioning apparatus; or receive the first information of the scene to be spatially designed in a communication manner.

In summary, the method for space design and the system for space design according to the present disclosure are capable of simultaneously acquiring information about a scene and a target object to be placed in the scene from a device such as a portable device, after performing the visual presentation of the information, the user who performs the space design can observe the design effects in real-time base on the layout of the target object on the visual presentation, thereby determining whether to purchase, the construction can further be instructed according to the calculated construction information after designing, thus the design on the virtual visual presentation may be put into practice to recover to the actual scene.

The two specific implementations of the method for space design provided in accordance with the present disclosure are described below by two specific embodiments. In the first embodiment, a smart mobile communication device application software (for example, a dedicated application running on an Android or IOS operating system), a distance detecting and positioning apparatus (which may be a surveying tool such as a ranging instrument, a ranging wheel, or which may also be a smart terminal such as a mobile phone or a Pad, an AR glasses, etc.) a scene (such as a wall, etc.), and a plurality of target objects. In this embodiment, the virtual scene can be first created by the smart mobile communication device application software, that is, the virtual image of the target object can be placed in the virtual scene and designed, and then the specified target object can be positioned in the current scene by the distance detecting and positioning apparatus.

Next, the specific implementation steps are described:

Firstly, acquiring a virtual design can be acquired by the following methods: the first method is to build a virtual scene (for example, provide a background image of the scene and its size) using smart mobile communication device application software. In the virtual scene, the outline shape of the target object may be drawn, and the size information of the target object may be acquired before loading. After acquiring the size information, it is possible to perform a specific design, such as a placement position. The second method is to acquire design drawings by a third-party platform. The design drawings may be imported into the smart mobile communication device application software by current mainstream wireless transmission ways (such as network http/https transmission, mail, apple airdrop, etc.). The smart mobile communication device application software has applied a specific file format corresponding to the apparatus operating system during the installation process, and when the file which is of the format file may be found, the above-mentioned smart mobile communication device application software can be recommended to the user to open the file. The drawing file may be parsed by the smart mobile communication device application software, and the file content can be parsed into a picture on the drawing, a coordinate point of the graphic outline, a coordinate point of the position, etc., and can be saved in the local database and rendered into a virtual design display by the communication device.

Then, the smart mobile communication device application software connects to the distance detecting apparatus via Bluetooth, and transmits the position information in the design to the distance detecting and positioning apparatus via Bluetooth.

Finally, by means of the positioning function of the distance detecting and positioning apparatus, the actual position of the target object in the design in the current scene is found, and the target object is placed. Virtual design may be converted to reality.

The embodiment to be described next will introduce how to convert a displayed scene into a virtual scene presentation by a distance detecting and positioning apparatus. In this method, the distance detecting and positioning apparatus may be used to measure the size of the corresponding scene which may be synchronized to the smart mobile communication device application software via Bluetooth, and the data may be converted into real distance information and stored in the local database by the software. Next, the size information acquired before using the smart mobile communication device application software may be as the size of the scene to build the virtual scene. The display of the scene on the smart mobile communication device application software filled the screen in one direction may be a reference to determine the scaling ratio, to convert the real size information into the points on the screen based on the scaling ratio, and to draw the points. Then, the size and position information of the target object can be measured by the distance detecting and positioning apparatus, and synchronized to the smart mobile communication device application software via Bluetooth and saved in the local database, and then converted into the points on the screen according to the previously acquired size and distance information and according to the previously determined scaling ratio, and the virtual size and respective outline of the target object can be drawn and then the design is made. Finally, at the time of saving, the size of the scene, the binary data of the picture, the coordinate information of the outline of the graphic, and the coordinate information of the position may be converted into a dedicated file format according to a defined method and stored in the local database. The virtual design file can be shared with a third party platform or the like with reference to the description in the previous embodiment. The actual scene is converted into a virtual design.

It will be understood by those skilled in the art that many changes and modifications of the above disclosed embodiments can be made without departing from the scope of the invention. Therefore, the scope of the invention should be defined by the appended claims.

Although various exemplary embodiments of the present invention have been described, it is apparent to those skilled in the art that various changes and modifications can be made without departing from the spirit and scope of the invention to achieve one or some of the advantages of the present invention. It is apparent to those skilled in the art that other components performing the same function may be appropriately replaced. It will be appreciated that features explained herein with reference to particular figures may be combined with features of other figures, even in those cases where this is not explicitly mentioned. Moreover, the method of the present invention can be implemented in either a software implementation using appropriate processor instructions or in a hybrid implementation using a combination of hardware logic and software logic to achieve the same results. Such modifications to the aspects of the invention are intended to be covered by the appended claims.

What is claimed is:

1. A method for space design, the method comprising:
   acquiring first information of a physical space by a ranging and positioning apparatus, the first information including size measurement information of the physical space;
   receiving the first information of the physical space by a computing device from the ranging and positioning apparatus through a communication interface of the computing device;
   acquiring second information of a target object from a third party by the computing device through the communication interface of the computing device, the second information including size measurement information of the target object;
   performing a visual presentation of the first information of the physical space and the second information of the target object on a display interface of the computing device;
   calculating construction information of the target object being placed in the physical space by the computing device based on a layout of the target object on the visual presentation according to the first information of the physical space and the second information of the target object;
   outputting the calculated construction information through the communication interface of the computing device to the ranging and positioning apparatus; and
   guiding a user to position the target object in the physical space using a positioning function of the ranging and positioning apparatus according to the construction information, the size measurement information of the physical space, and the size measurement information of the target object.

2. The method of claim 1, wherein the construction information comprises construction marking points displayed on the visual presentation to implement the layout of the target object by augmented reality technology.

3. The method of claim 1, wherein the first information and/or the second information further comprise color information and/or material information.

4. The method of claim 1, wherein the second information further comprises brand, price, inventory, and hyperlink information associated with the target object.

5. A system for space design, the system comprising:
   a ranging and positioning apparatus configured to acquire first information of a physical space, the first information including size measurement information of the physical space; and
   a computing device configured to:
      receive the first information of the physical space from the ranging and positioning apparatus through a communication interface of the computing device;
      acquire second information of a target object from a third party through the communication interface of the computing device, the second information including size measurement information of the target object;
      perform a visual presentation of the first information of the physical space and the second information of the target object;
      calculate construction information of the target object being placed in the physical space based on a layout of the target object on the visual presentation according to the first information of the physical space and the second information of the target object; and output the calculated construction information through the communication interface of the computing device to the ranging and positioning apparatus;

wherein the ranging and positioning apparatus is further configured to guide a user to position the target object in the physical space using a positioning function according to the construction information, the size measurement information of the physical space, and the size measurement information of the target object.

6. The system of claim 5, wherein the construction information comprises construction marking points displayed on the visual presentation to implement the layout of the target object by augmented reality technology.

7. The system of claim 5, wherein the first information and/or the second information further comprise color information and/or material information.

8. The system of claim 5, wherein the second information further comprises brand, price, inventory, and hyperlink information associated with the target object.

9. A method for space design, the method comprising:

receiving first information of a physical space by a computing device through a communication interface of the computing device, the first information including size measurement information of the physical space;

acquiring second information of a target object from a third party by the computing device through the communication interface of the computing device, the second information including size measurement information of the target object;

displaying the first information of the physical space and the second information of the target object on a display interface of the computing device;

calculating construction information of the target object being placed in the physical space by the computing device based on a layout of the target object on the display according to the first information of the physical space and the second information of the target object;

outputting the calculated construction information through the communication interface of the computing device to a ranging and positioning apparatus; and guiding a user to position the target object in the physical space using a positioning function of the ranging and positioning apparatus according to the construction information, the size measurement information of the physical space, and the size measurement information of the target object.

10. The method of claim 9, wherein the construction information comprises construction marking points displayed on the visual presentation to implement the layout of the target object using computer generated reality technology.

11. The method of claim 9, wherein the first information and/or the second information further comprise color information and/or material information.

12. The method of claim 9, wherein the second information further comprises brand, price, inventory, and hyperlink information associated with the target object.

13. The method of claim 1, wherein the ranging and positioning apparatus includes a ranging wheel.

* * * * *